US010126342B2

United States Patent
Moore et al.

(10) Patent No.: US 10,126,342 B2
(45) Date of Patent: Nov. 13, 2018

(54) ELECTRICAL HUB INCLUDING CURRENT SENSOR

(71) Applicant: BOSE CORPORATION, Framingham, MA (US)

(72) Inventors: Douglas C. Moore, Framingham, MA (US); Anthony John Marino, Framingham, MA (US); Neil Gelfond, Framingham, MA (US)

(73) Assignee: BOSE CORPORATION, Framingham, MA (US)

( * ) Notice: Subject to any disclaimer, the term of this patent is extended or adjusted under 35 U.S.C. 154(b) by 225 days.

(21) Appl. No.: 14/850,143

(22) Filed: Sep. 10, 2015

(65) Prior Publication Data

US 2017/0052838 A1     Feb. 23, 2017

Related U.S. Application Data

(60) Provisional application No. 62/207,677, filed on Aug. 20, 2015.

(51) Int. Cl.
| G01R 31/00 | (2006.01) |
| G06F 11/07 | (2006.01) |
| G05F 1/00 | (2006.01) |
| G05B 23/02 | (2006.01) |

(52) U.S. Cl.
CPC ......... *G01R 31/00* (2013.01); *G05B 23/0235* (2013.01); *G05F 1/00* (2013.01); *G06F 11/079* (2013.01)

(58) Field of Classification Search
CPC ............. G06F 11/0769; G06F 11/079; G06F 11/0721; G01R 31/00; G05B 23/0235; G05F 1/00
USPC ...................................................... 307/36–42
See application file for complete search history.

(56) References Cited

U.S. PATENT DOCUMENTS

| 2008/0094210 | A1 | 4/2008 | Paradiso et al. | |
| 2009/0206059 | A1* | 8/2009 | Kiko | H02J 3/14 218/143 |
| 2011/0101777 | A1 | 5/2011 | Jansma | |
| 2011/0266869 | A1 | 11/2011 | Katru et al. | |
| 2012/0080944 | A1* | 4/2012 | Recker | H02J 9/02 307/25 |
| 2013/0015714 | A1 | 1/2013 | Kwok | |
| 2014/0312691 | A1* | 10/2014 | Doljack | H02J 7/0036 307/29 |
| 2016/0141810 | A1* | 5/2016 | Kashyap | H01R 13/6683 439/620.01 |

* cited by examiner

*Primary Examiner* — Jeff Natalini
(74) *Attorney, Agent, or Firm* — Patterson + Sheridan, LLP (57) ABSTRACT

A method and system provides current, from an electrical hub, to a device. The method and system further receives, at the electrical hub, an indication that the device is in a first configuration state of a plurality of configuration states. An example includes detecting, at the electrical hub, a detected current value of the current sent to the device. Processes include determining, at the electrical hub, whether to generate an error indication based on a comparison of the detected current value and a first reference value or range of values associated with the first configuration state.

17 Claims, 8 Drawing Sheets

ELECTRICAL HUB INCLUDING CURRENT SENSOR

CLAIM OF PRIORITY

The present application claims the benefit of and priority from U.S. Provisional Application Ser. No. 62/207,677, filed Aug. 20, 2015 and titled "ELECTRICAL HUB INCLUDING CURRENT SENSOR," which is expressly incorporated herein by reference in its entirety.

FIELD OF THE DISCLOSURE

This disclosure relates to electrical hubs.

BACKGROUND

Certain marketing efforts use powered displays to demonstrate electronic merchandise. For example, displays of cellular telephones, headphones, audio equipment and other electrical devices allow potential buyers to see and use desirable features. In contrast to the investment in the products, the displays are relatively cheap and technologically limited. As a result, the merchandise may be undersold due to shortcomings in the electronic displays.

SUMMARY

The present disclosure describes a "smart" electrical hub and methods of operating the smart electrical hub. The smart electrical hub can detect when a component of a device fails. In some examples, the smart electrical hub includes a current sensor that detects current flowing to a device. In some examples the device has a variety of configuration states according to which the device operates one or more components (e.g., speakers). Each of the configuration states has an associated current (e.g., an expected current) that is expected to be drawn by the device during operation according to the configuration state. The device also includes a state indicator indicating which configuration state is active. The smart electrical hub includes a processor that compares the detected current to the expected current value associated with the state of the first device to determine whether to generate an error indication.

In one implementation of an apparatus, an electrical hub includes a first connector configured to receive power from a power supply. The apparatus further includes a second connector configured to supply power to a device. The apparatus further includes a current sensor coupled to the second connector. The apparatus further includes a communications interface and a processor configured to receive, via the communication interface, an indication that the device is in a first configuration state of a plurality of configuration states. The processor is further configured to receive a detected current value from the current sensor and to determine whether to generate an error indicator based on a comparison of the detected current value and a reference value or range of values associated with the first configuration state.

In another implementation, a method includes providing current, from an electrical hub, to a device. The method further includes receiving, at the electrical hub, an indication that the device is in a first configuration state of a plurality of configuration states. The method further includes detecting, at the electrical hub, a detected current value of the current provided to the device. The method further includes determining, at the electrical hub, whether to generate an error indication based on a comparison of the detected current value and a first reference value or range of values associated with the first configuration state.

In another implementation, a computer readable storage device stores instructions that, when executed by a processor, cause the processor to perform operations. The operations include receiving a first indication at an electrical hub during a configuration mode while the electrical hub provides a first current to the device, the first indication indicating that the device is in a first configuration state of a plurality of configuration states. The operations further include measuring the current at the electrical hub to determine a first reference value corresponding to the first configuration state. The operations further include storing the first reference value at a memory within the electrical hub. The operations further include receiving a second indication at the electrical hub during the configuration mode while the electrical hub provides a second current to the device, the second indication indicating that the device is in a second configuration state of the plurality of configuration states. The operations further include measuring the second current at the electrical hub to determine a second reference value corresponding to the second configuration state. The operations further include storing the second reference value at the memory within the electrical hub.

DETAILED DESCRIPTION

An example of a system displays merchandise using a smart hub to monitor media and electricity provided to demonstrate product capabilities. The system allows an early detection of a failure or abnormality in a merchandise display to facilitate display repair and operation. The hub includes a microprocessor to recognize (e.g., based on an indicator received from the system) a state of the system. The hub provides an electrical connection between a power supply, a product, a demonstration engine, one or more other loads (e.g., light emitting diodes (LEDs), liquid crystal displays (LCDs), etc.), or a combination thereof. The system operates in different states. A first state (e.g., a quiescent state) includes currents that flow through the hub and add up to a constant. In some examples, a constant current is provided at the state. The system operates in one or more active states (e.g., N active states at N different current loads).

The system provides a current connection to the hub along with an additional connection to the demonstration engine.

The demonstration engine provides information regarding the operating state to the hub. The hub uses current detection circuitry to determine whether the system is operating normally. In an example, the system compares a total measured current (e.g., output to multiple devices) or an individual measured current (e.g., output to a single device) to an expected current value of the present operating state. When an unexpected or abnormal condition is detected, the microprocessor of the hub communicates with a main processor of the demonstration engine. In some examples, the processor uses a network connection to contact a central home site. In some examples, the current sensor is positioned along more than one electrical path from the hub (e.g., along a first path to the demonstration engine and along a second path to another load) to detect a failure or abnormality of a particular part of a display.

In an example, expected current values are determined in a learning mode. The demonstration engine toggles though operating states while the microprocessor and current detection circuitry in the hub are used to measure and create a library of normal currents associated with each state.

Figure 1:
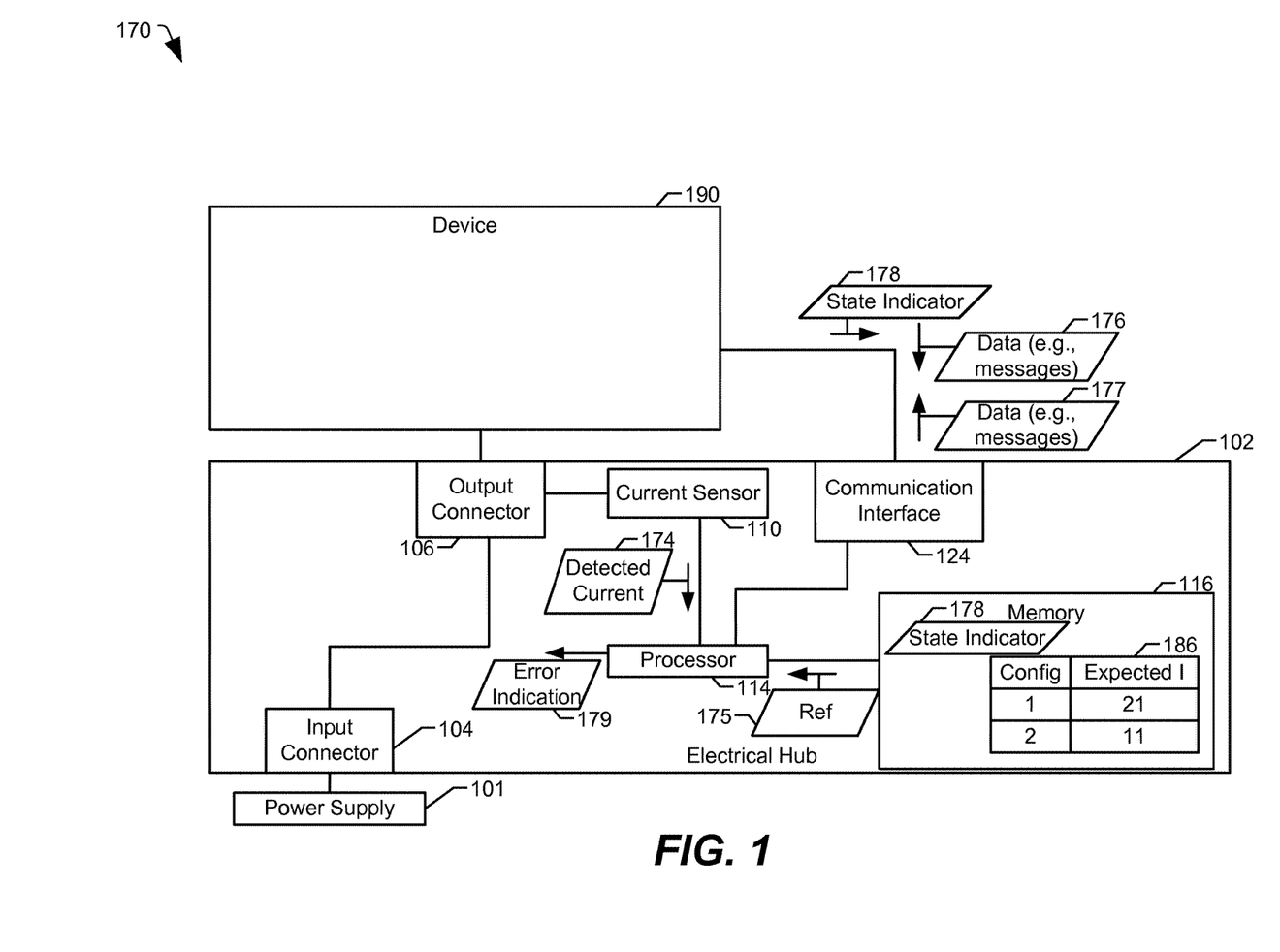
FIG. 1 is a diagram of a system including an electrical hub with a current sensor.

Referring to FIG. 1, a diagram of a system 170 that includes an electrical hub 102 with a current sensor is shown. The electrical hub 102 is configured to provide power to another device, such as a device 190. The electrical hub 102 detects errors associated with the device 190 by monitoring current output to the device 190. In the example illustrated in FIG. 1, the electrical hub 102 monitors current output to a single device. In other examples, the electrical hub 102 is configured to provide power to multiple devices, to monitor current provided to the multiple devices, and to detect errors associated with the multiple devices.

The electrical hub 102 includes an input connector 104 that is coupled to a power supply 101. In a particular example, the power supply 101 includes one or more batteries, an alternating current (AC) to direct current (DC) converter, or an alternating current source. The electrical hub 102 includes an output connector 106. While the electrical hub 102 illustrated in FIG. 1 includes a single output connector, in other examples the electrical hub 102 includes more than one output connector. The output connector 106 is configured to provide power to the device 190 based on the power received from the power supply 101. The output connector 106 is coupled to a corresponding current sensor 110 that measures current output at the output connector 106.

The electrical hub 102 further includes a processor 114 and a memory 116. In some examples, the memory 116 is a solid state drive, random access memory (RAM), a hard disk drive, or another type of memory device. The processor 114 is coupled to the current sensor 110 to receive detected current values from the current sensor 110. The processor 114 is also coupled to a communication interface 124. In some examples, the communications interface 124 is a bi-directional communication interface. In particular examples, the communication interface 124 is a universal serial bus (USB) interface, an Ethernet interface, an Institute of Electrical and Electronics Engineers (IEEE) 802.11 interface, an IEEE 802.15 interface, or other type of communication interface. In some examples, the processor 114 communicates with the device 190 via the communication interface 124. For example, the processor 114 sends data 177 (e.g., messages) to or receives data 176 (e.g., messages) from the device 190 via the communication interface 124. While not illustrated, in particular examples, the communication interface 124 communicates with the device 190 via one or more networks (e.g., a Local Area Network, the Internet, or a combination thereof). While not shown in the example illustrated in FIG. 1, in other examples, the processor 114 communicates with other devices via the communication interface 124. Examples of other devices that the processor 114 may communicate with include other devices powered by the electrical hub 114, one or more servers, other electrical hubs, or a combination thereof.

While various components of the electrical hub 102 are illustrated in FIG. 1 as being directly coupled to the processor 114, in other examples, the components of the electrical hub 102 communicate utilizing a different path and/or one or more intermediate components not shown in FIG. 1. To illustrate, alternate examples of the electrical hub 102 include a bus, and the various components of the electrical hub 102 communicate via the bus.

In operation, the electrical hub 102 provides power, in the form of a current, to the device 190. The device 190 is configured to use the current to operate in a plurality of different configuration states. For example, the device 190 operates differently in each of the different configuration states. Each configuration state is associated with a set of components of the device 190 or of a different device, a media content item, a set of settings (e.g., volume), or a combination thereof. In a particular illustrative example, the device 190 includes a speaker system configured to utilize a different set of components (e.g., speakers, light emitting diodes, display devices, etc.) in each configuration state. In another particular example (described below in reference to FIG. 2), the device 190 corresponds to a demonstration engine configured to control operation of a demonstration product (e.g., a speaker system) and each configuration state corresponds to a different set of demonstration operations. The device 190 is configured to draw the current from the electrical hub 102 to generate signals used to operate in each of the configuration states. To illustrate, the device 190 is configured to use the current to send first signals (not shown) to drive a first combination of speakers (not shown) of the device 190 while in a first configuration state. The device 190 is configured to send second signals associated to a second combination of speakers different from the first combination while in a second configuration state. Examples of sending signals to components are described further below with reference to FIG. 2.

Since each configuration state is associated with drawing current to operate in a particular way, each configuration state has an associated expected current draw. In the example shown in FIG. 1, the memory 116 of the electrical hub 102 stores data representing a table 186 mapping the configuration states of the device 190 to expected current values. In some examples, the table 186 maps the configuration states to expected current ranges. In some examples, data shown in the table 116 of FIG. 1 is stored in a data structure other than a table.

In the illustrated example, the table 186 indicates that the device 190 is expected to draw 21 amps when operating in a first configuration state. However, errors can occur that prevent the device 190 from operating according to the first configuration state. For example, connections between components of the device 190 may come loose or one or more of the components can break. The device 190 may not send signals as normal to a broken or disconnected component. Thus, when a component associated with the first configuration state is inoperable, the device 190 draws less than 21 amps when operating in the first configuration state. The electrical hub 102 illustrated in FIG. 1 enables detection of such errors.

When the device 190 changes configuration states (e.g., in response to a program or a user selection), the electrical hub 102 receives updates via the communication interface 124 that include a state indicator 178 from the device 190. The state indicator 178 indicates which configuration state the device 190 has entered. Responsive to the received state indicator 178, the processor 114 of the electrical hub 102 configured to identify a reference value or range of values 175 (e.g., an expected current value or current range) using the table 186. The processor 114 is configured to compare the reference value or range of values 175 to a detected current value 174 received from the current sensor 110. When the reference value or range of values 175 is a reference value, in response to detecting that a difference between the reference value and the detected current value 174 is greater than a threshold, the processor 114 is configured to determine that an error has occurred. When the reference value or range of values 175 is a range of values, in response to detecting that the detected current value 174 is outside of the range of values, the processor 114 is configured to determine that an error has occurred. Since each configuration state is associated with signals sent to a particular set of components, the processor 114 is able to identify a set of components that includes a potentially inoperable component based on an error occurring during operation according to a particular configuration state. In particular examples, the processor 114 is configured to identify which component (not shown) of the device 190 (or a device operated by the device 190) has malfunctioned based on the detected current value 174 as described below with reference to FIG. 5.

In a particular example, once the processor 114 determines that an error has occurred, the processor 114 is configured to generate an error indication 124. In some examples, the error indication is a message to another device (e.g., a server) or a signal output to a light emitting diode (LED) device, as explained further below with reference to FIG. 2. In particular examples, after the electrical hub 102 determines whether to generate the error indication 124, the electrical hub 102 is configured to continue to monitor current detected by the current sensor 110 and compare the monitored current to expected current values or current ranges for each configuration state the device 190 enters (e.g., in response to a user selection or a program). Thus, FIG. 1 illustrates a system in which an electrical hub determines whether a value of a current output to a device matches an expected current value or range of values associated with a configuration state that the device is operating in. The electrical hub is able to determine whether a component of the device is inoperable based on whether the value matches the expected current value or range of values. Therefore, the system 100 enables detection and identification of malfunctioning components associated with a configuration state of a device.

Figure 2:
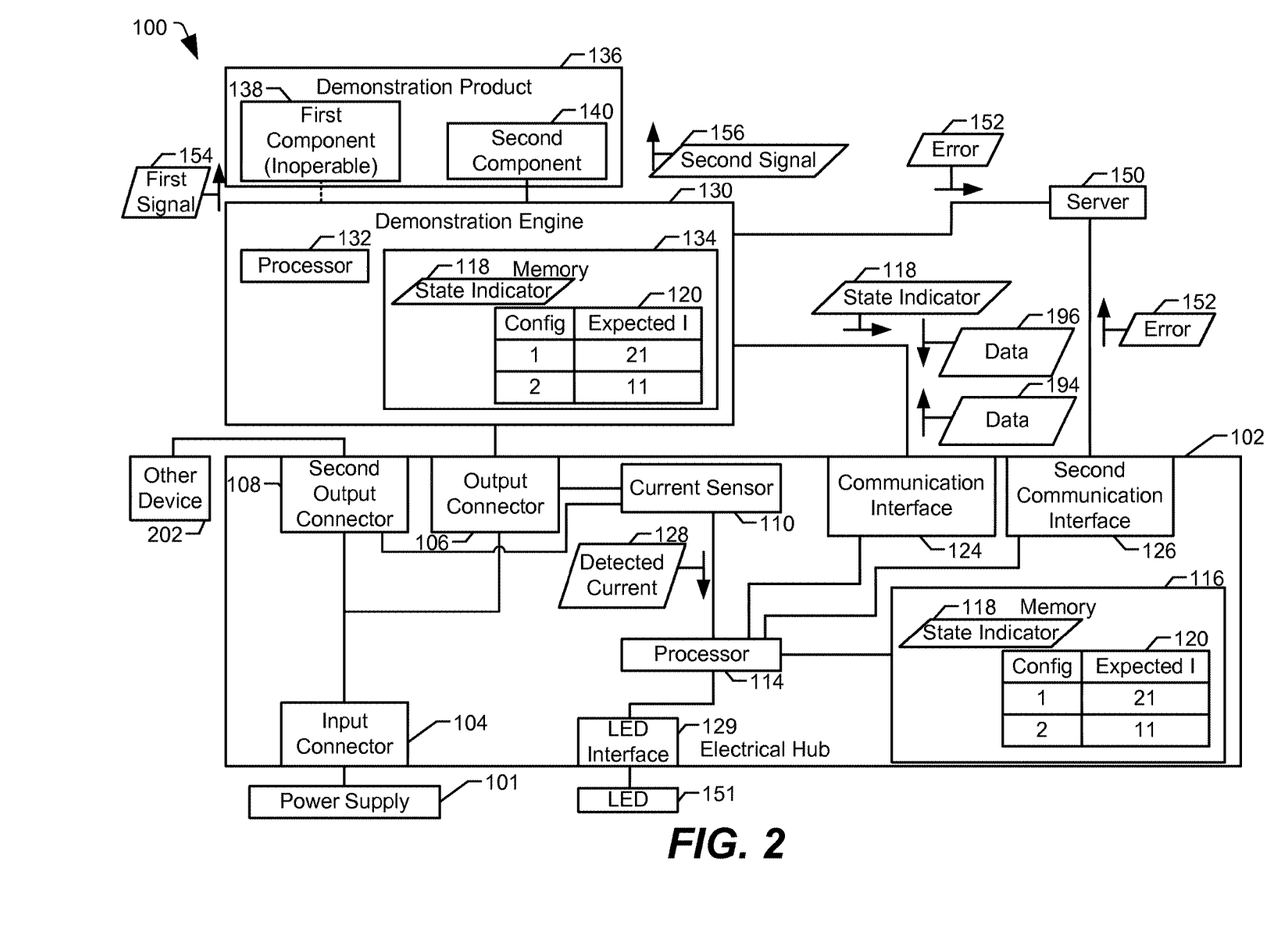
FIG. 2 is a diagram of another system including an electrical hub with a current sensor.

Referring to FIG. 2, a diagram of another system 100 including the electrical hub 102 is shown. FIG. 2 depicts another configuration of the electrical hub 102 that includes additional components, as explained below. In the system 100, the electrical hub 102 provides power to a demonstration engine 130 that operates a demonstration product 136 (e.g., a speaker system, a headset, or other consumer electronic device). In some examples, the demonstration engine 130 corresponds to the device 190 shown in FIG. 1. The electrical hub 102 is configured to detect errors in the demonstration product 136 by monitoring current output to the demonstration engine 130. In some examples, the demonstration engine 130 and the electrical hub 102 are part of an in-store display of the demonstration product 136.

The electrical hub 102 includes a plurality of output connectors. The plurality of output connectors includes the output connector 106 and a second output connector 108. Other examples include more or less output connectors. Each of the output connectors 106, 108 is configured to transmit power received from the power supply 101 to one or more devices as one or more currents. In the illustrated example, the output connector 106 is coupled to the demonstration engine 130 (e.g., a first device) and the second output connector 108 is coupled to another device 202. In particular examples, the other device 202 operates as a "static load" that draws a relatively constant current from the electrical hub 102. In particular examples, the other device 202 corresponds to an LED, to an LCD, or to some other device. In other examples, fewer or more other devices are coupled to the electrical hub 102 in other examples.

In the example of FIG. 2, each of output connectors 106, 108 is coupled to the current sensor 110. The current sensor 110 detects a sum of currents output by the output connector 106 and the second output connector 108. In alternative examples, the output connectors 106, 108 are connected to different current sensors, as explained below with reference to FIG. 3. In the example illustrated in FIG. 2, the processor 114 is coupled to the current sensor 110, and receives detected current values from the current sensor 110.

The processor 114 is coupled to a light emitting diode (LED) interface 129. The LED interface 129 is coupled to an LED device 151. In a particular embodiment, the LED interface 129 is configured to transmit control signals to the LED 151 based on signals received from the processor 114. In alternative embodiments, the LED interface 129 is configured to provide a current connection to the LED 151 that is not based on signals from the processor 114 (e.g., the LED 151 is a static load). In some configurations, the electrical hub 102 is coupled to more or no LEDs. The processor 114 is coupled to the communication interface 124, as described above, and to a second communication interface 126. In some examples, the processor 114 communicates with the demonstration engine 130 via the communication interface 124. For example, the processor 114 may send data 194 (e.g., messages) to or receive data 196 (e.g., messages) from the demonstration engine 130 via the communication interface 124. While not illustrated, in particular examples, the communication interface 124 communicates with the demonstration engine 130 via one or more networks (e.g., a Local Area Network, the Internet, or a combination thereof). In some examples, current output by the LED interface 129 to the LED 151 is measured by the current sensor 110.

In particular examples, the second communication interface 126 is a USB interface, an Ethernet interface, an IEEE 802.11 interface, an IEEE 802.15 interface, or other type of communication interface. In some examples, the processor 114 communicates with a server 150 via the second communication interface 126. For example, the processor 114 may send messages or data to or receive messages or data from the server 150 via the second communication interface 126. In other examples, the server 150 receives messages and/or data from the demonstration engine 130 instead of directly from the electrical hub 102. While not illustrated, in particular examples, the second communication interface 126 communicates with the server 150 via one or more networks (e.g., a Local Area Network, the Internet, or a combination thereof). In other examples, the electrical hub 102 includes more or fewer communication interfaces. In particular examples, the communication interface 124 and the second communication interface 126 are the same interface.

While various components of the electrical hub 102 are illustrated as being directly coupled to the processor 114 in FIG. 2, in other examples, the components of the electrical hub 102 shown in FIG. 2 communicate utilizing a different path and/or one or more intermediate components not shown in FIG. 2. For example, as explained above, alternate examples of the electrical hub 102 include a bus, and the various components of the electrical hub 102 communicate via the bus.

Referring to the demonstration engine 130, the demonstration engine 130 includes a second processor 132 and a second memory 134. In some examples, the second memory 134 is a solid state drive, random access memory (RAM), a hard disk drive, or another type of memory device. The demonstration engine 130 is coupled to the demonstration product 136. The demonstration engine 130 is illustrated as being in communication with the server 150. In particular examples, the demonstration engine 130 communicates with the server 150 via a wide area network, such as the internet, a local area network, or a combination thereof. While both demonstration engine 130 and the electrical hub 102 are shown as independently communicating with the server 150, in some examples one or both of the demonstration engine 130 and the electrical hub 102 do not communicate with the server 150.

The demonstration product 136 includes a first component 138 and a second component 140. In particular examples, the components 138, 140 include a light emitting diode (LED), a speaker, a speaker system, a headset, or a combination thereof. In some examples, the demonstration product 136 includes more or fewer components.

In operation, the second processor 132 of the demonstration engine 130 is configured to cause one or more signals to be output to the components 138, 140 of the demonstration product 136. The demonstration engine 130 is configured to generate the signal(s) using current(s) drawn from the electrical hub 102 via the output connector 106. The signals output are based on configuration states stored in the second memory 134. Each configuration state may correspond to a different set of demonstration operations (e.g., a routine or program designed to showcase features of the demonstration product 136). In an illustrative example, each configuration state corresponds to a media content item (e.g., a song used to showcase speakers) to be output at the demonstration product 136, a set of settings (e.g., volume level) to be used by the demonstration product 136 to output the media content item, a set of components (e.g., a set of speakers) of the demonstration product 136 to be used to output the media content item, or a combination thereof. The second memory 134 further stores data representing a state indicator 118 indicating which of the configuration states is currently active. In particular examples, the signals sent by the demonstration engine 130 activate, control, or drive one or more of the components 138, 140 (e.g., speakers). In the illustrated example, the demonstration engine 130 is configured to output a first signal 154 to the first component 138 when in a first configuration state and to output a second signal 156 to the second component 140 when in a second configuration state. In alternate examples, the demonstration engine 130 is configured to output more than one signal to more than one component of the demonstration product 136 while in a single state.

Each of the configuration states has an associated expected current value or current range (e.g., a reference value). The expected current value or range includes an amount of current to be drawn from the electrical hub 102 by the demonstration engine 130 while the demonstration engine 130 is operating the demonstration product 136 according to the associated configuration state. In particular examples, the expected current value or range further includes an amount of current to be drawn by one or more other devices (e.g., the other device 202) coupled to the electrical hub 102. In an illustrative example, the expected current value for a particular configuration state is a sum of currents that the demonstration engine 130 is configured to output when in the particular configuration state (plus a "static" expected current to be output to the other device 202). In the example shown in FIG. 2, the second memory 134 stores data representing a table 120 mapping the configuration states to expected current values. In other examples, the table 120 stores data representing mappings between configuration states and expected current ranges. The memory 116 of the electrical current hub 102 also stores data representing the table 120. In alternate examples, the second memory 134 does not store the table 120. In some examples, data shown in the table 120 of FIG. 2 is stored in a different data structure than a table.

In the illustrated example, the table 120 indicates that the demonstration engine 130 is expected to draw 21 amps when operating the demonstration engine 136 in a first configuration state. However, in reality, errors can occur that prevent the demonstration engine 130 from operating the demonstration product 136 according to the first configuration state. For example, connections between demonstration product 136 and the demonstration engine 130 can come loose or one or more of the components 138, 140 can break. Further, errors can occur that prevent the other device 202 from drawing the static current. When such errors occur, the demonstration engine 130 and the other device 202 draws less than 21 amps when the demonstration engine 130 is operating in the first configuration state (e.g., because the demonstration engine 130 cannot provide a signal to a disconnected or broken component or because the other device 202 cannot draw a current). In FIG. 2, a link between the first component 138 and the demonstration engine 130 is drawn with dashed line to represent that the link has been severed. Thus, the demonstration engine 130 is unable to output the first signal 154 to the first component 138 while the demonstration engine 130 is in the first configuration state. Accordingly, the demonstration 130 will use less current when operating in the first configuration state than recorded in the table 120. The electrical hub 102 illustrated in FIG. 2 enables detection of such errors, as described below.

When the demonstration engine 130 changes configuration states, the electrical hub 102 receives updates via the communication interface 124 that include the state indicator 118 from the demonstration engine 130. Responsive to the received state indicator 118, the processor 114 of the electrical hub 102 is configured to identify an expected current value using the table 120. The processor 114 is configured to compare the expected current value to a detected current value 128 received from the current sensor 110. In response to detecting that the detected current value 128 differs from (e.g., is lower than or outside of) the expected current value or range, the processor 114 is configured to determine that an error has occurred. In particular examples, the processor 114 is configured to identify which component of the demonstration product 136 or the other device 202 has malfunctioned as described below with reference to FIG. 5.

In a particular example, once the processor 114 determines that an error has occurred, the processor 114 is configured to generate an error indication. In some examples, the error indication is an error message 152 to the server 150 via the second communication interface 126. In some examples, the error message 152 identifies the electrical hub 102, the demonstration engine 130, the demonstration product 136, a malfunctioning component of the demonstration product, the configuration state that caused the error, a set of components or devices associated with the configuration state that caused the error, a location of the demonstration product 136, the other device 202, or a combination thereof. In some examples, the processor 114 is configured to generate the error indication by activating the LED 151 via the LED interface 129 in response to determining that the error has occurred. In a particular embodiment, a pattern of lights activated by the processor 114 is based on operation according to which configuration state caused the error, which component of the demonstration product 136 failed, or a combination thereof.

Thus, FIG. 2 illustrates a system in which an electrical hub is configured to detect errors that occur at another device based on detected current values. It should be noted that in particular alternate examples to the one shown in FIG. 2, the demonstration engine 130 detects errors rather than the electrical hub 102. For example, in such alternate examples, the electrical hub 102 sends the detected current 128 (e.g., as part of the data 194) to the demonstration engine 130 via the communication interface 124, and the demonstration engine 130 compares the detected current 128 to the expected current value (or range) to detect errors. In some examples, the electrical hub 102 sends the detected current 128 to the demonstration engine periodically, in response to request(s) (e.g., sent as part of the data 196) from the demonstration engine 130, or a combination thereof. In particular examples, the demonstration engine 130 logs detected errors and/or generates and sends error messages (e.g., the error message 152) to the server 150. In still other examples, functions of the demonstration engine 130 and the electrical hub 102 are combined into one device.

Figure 3:
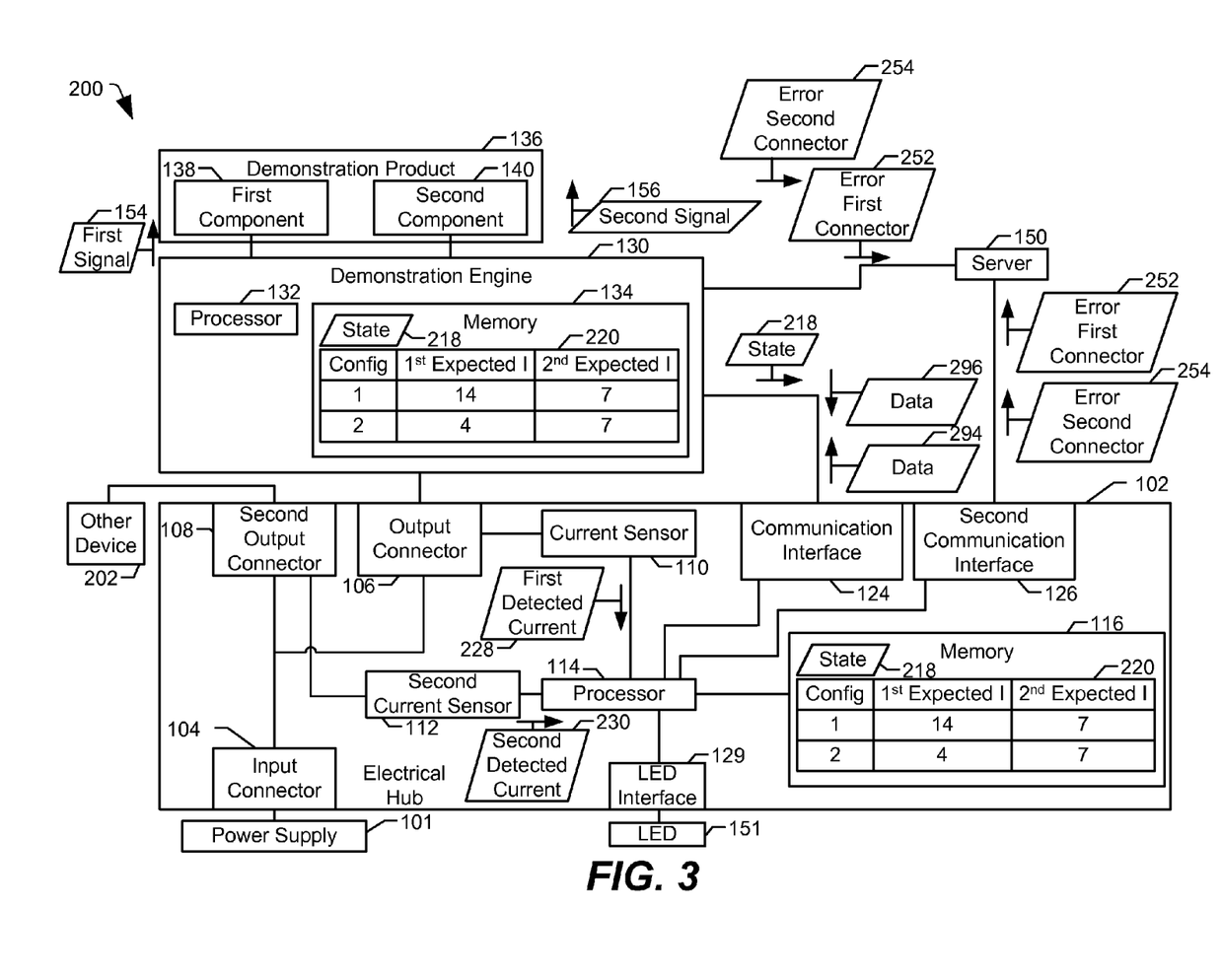
FIG. 3 is a diagram of another system including an electrical hub with a current sensor.

Referring to FIG. 3, a diagram of a system 200 including the electrical hub 102 is shown. The system 200 includes the demonstration engine 130, and the demonstration product 136, as shown in FIG. 2. In some examples, the electrical hub 102, the demonstration engine 130, and the demonstration product 136 operate as described above except for differences explained with reference to FIG. 3.

In the system 200, the output connector 106 is coupled to the current sensor 110, as described above, but the second output connector 108 is coupled to a second current sensor 112. Thus, the processor 114 is able to independently detect currents output to the other device 202 and to the demonstration engine 130. As described above, the demonstration engine 130 operates the components 138, 140 of the demonstration product 136 according to a plurality of configuration states. Unlike the system 100 where each configuration state is associated with one expected current, in the system 200, each of the configuration states is associated with a first expected current (e.g., a first reference value or range) and a second expected current (e.g., a second reference value or range). The first expected current is associated with the output connector 106 and the second expected current is associated with the second output connector 108.

The second memory 134 stores data representing a table 220 indicating a mapping between each configuration state and the associated first expected current (e.g., a first reference value or range) and the associated second expected current (e.g., a second reference value or range). The first expected current corresponds to the first current received via the output connector 106, and the second expected current value corresponds to the second current received via the second output connector 108. The second memory 134 further stores data representing a state indicator 218 indicating which configuration state according to which the demonstration engine 130 is operating the demonstration product 136. The memory 116 stores data representing the table 220. In some examples, a data structure other than a table is used to store the mappings between the configuration states and the expected current values. In some examples, the second memory 134 does not store the table 220.

When the demonstration engine 130 changes configuration states, the electrical hub 102 receives updates via the communication interface 124 that include the state indicator 218 from the demonstration engine 130. Responsive to the received state indicator 218, the processor 114 of the electrical hub 102 is configured to identify a first expected current (e.g., a first reference value or range) and a second expected current (e.g., a second reference value or range) using the table 220. The processor 114 is configured to compare the first expected current to a first detected current value 228 received from the current sensor 110 and the second expected current to a second detected current value 230 received from the second current sensor 112. In response to detecting that the first detected current value 228 differs from the first expected current, the processor 114 is configured to determine that a first error has occurred (e.g., an error in the demonstration product 136 or the demonstration engine 130). In response to detecting that the second detected current value 230 differs from the second expected current, the processor 114 is configured to determine that a second error has occurred (e.g., an error in the other device 202).

In a particular example, the processor 114 is configured to generate a first error indication once the processor 114 has determined that the first error has occurred. In some examples, generating the first error indication includes sending a first error message 252 to the server 150 (e.g., via the second communication interface 126 or via the communication interface 124 and the demonstration engine 130). In some examples, the error message 252 identifies the electrical hub 102, the demonstration engine 130, the demonstration product 136, a malfunctioning component of the demonstration product, a group of components of the demonstration product 136 associated with the first expected current, a location of the demonstration product 136, or a combination thereof. In some examples, generating the first error indication includes activating the LED 151 via the LED interface 129. In a particular embodiment, a pattern of lights activated by the processor 114 in response to the first error identifies the first configuration state, which component of the demonstration product 136 failed, a group of components associated with the first expected current, or a combination thereof.

In a particular example, the processor 114 is configured to generate a second error indication in response to determining that the second error has occurred. In some examples, generating the second error indication includes sending a second error message 254 to the server 150 (e.g., via the second communication interface 126 or via the communication interface 124 and the demonstration engine 130). In some examples, the second error message 254 identifies the electrical hub 102, the other device 202, a location of the other device 202, or a combination thereof. In some examples, generating the second error indication includes activating the LED 151 via the LED interface 129. In a particular embodiment, a pattern of lights activated by the processor 114 indicates the configuration state that caused the second error, the other device 202, or a combination thereof.

Since, the first current and the second current are used by different devices, comparing each current to an expected current enables the electrical hub 102 to detect errors in specific devices. While FIG. 3 illustrates the electrical hub 102 providing two currents to two devices, it is to be understood that any number of currents may be provided to any number of devices. The electrical hub 102 monitors expected currents associated with groups of devices (as explained above with reference to FIG. 2), associated with individual devices (as described with reference to FIG. 3), or a combination thereof. Therefore, an electrical hub in accordance with the present disclosure is configured to detect errors that occur at other devices based on detected current values with different levels of specificity by detecting different numbers of currents.

While both demonstration engine 130 and the electrical hub 102 are shown as independently communicating with the server 150, in some examples one or both of the demonstration engine 130 and the electrical hub 102 do not communicate with the server 150. As explained above, it should be noted that in particular alternate examples to the one shown in FIG. 3, the demonstration engine 130 detects errors rather than the electrical hub 102. For example, in such alternate examples, the electrical hub 102 sends the first detected current 228 and the second detected current 230 (e.g., as part of the data 294) to the demonstration engine 130 via the communication interface 124, and the demonstration engine 130 compares the detected currents 228, 230 to the expected current values (or ranges) to detect errors. In some examples, the electrical hub 102 sends the detected currents 228, 230 to the demonstration engine 130 periodically, in response to request(s) (e.g., sent as part of the data 296) from the demonstration engine 130, or a combination thereof. In particular examples, the demonstration engine 130 logs detected errors and/or generates and sends error messages (e.g., the first error message 252 or the second error message 254) to the server 150. In still other examples, functions of the demonstration engine 130 and the electrical hub 102 are combined into one device.

Figure 4:
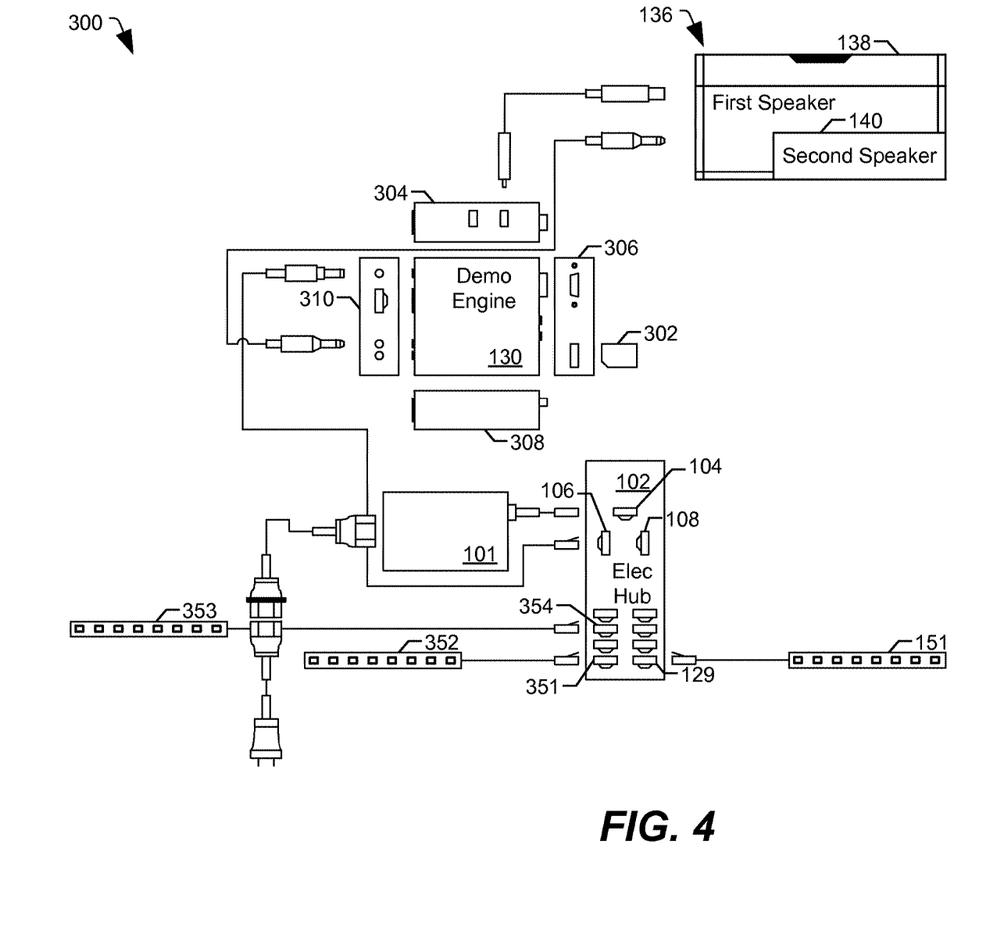
FIG. 4 is a diagram of another system including an electrical hub with a current sensor.

Referring to FIG. 4, a diagram of a system 300 that includes the electrical hub 102 is shown. The system 300 includes the power supply 101, the demonstration engine 130, the demonstration product 136, and the LED 151, a discussed herein. FIG. 4 further depicts profile views 304, 306, 308, 310 of the demonstration engine 130. The system 300 further includes a memory device 302. In a particular example, the memory device 302 is a portable memory device, such as a flash memory drive. The profile view 306 of the demonstration engine 130 includes a receptacle for receiving the memory device 302. In a particular example, the memory device 302 stores data comprising media files and the plurality of configuration states used by the demonstration engine 130 to operate the demonstration device 136. In FIG. 4, the components 138, 140 of the demonstration device 136 are speakers.

The system 300 further includes a second LED 352 and a third LED 353. In some examples, one or both of the second LED 352 or the third LED 353 correspond to a static load, such as the other device 202 described with reference to FIGS. 2-3.

The devices 101, 102, 130, 136, and 151 may operate as described above with reference to FIG. 2 or FIG. 3. Thus, FIG. 4 illustrates a system in which an electrical hub that is configured to detect errors that occur at another device based on detected current values.

Figure 5:
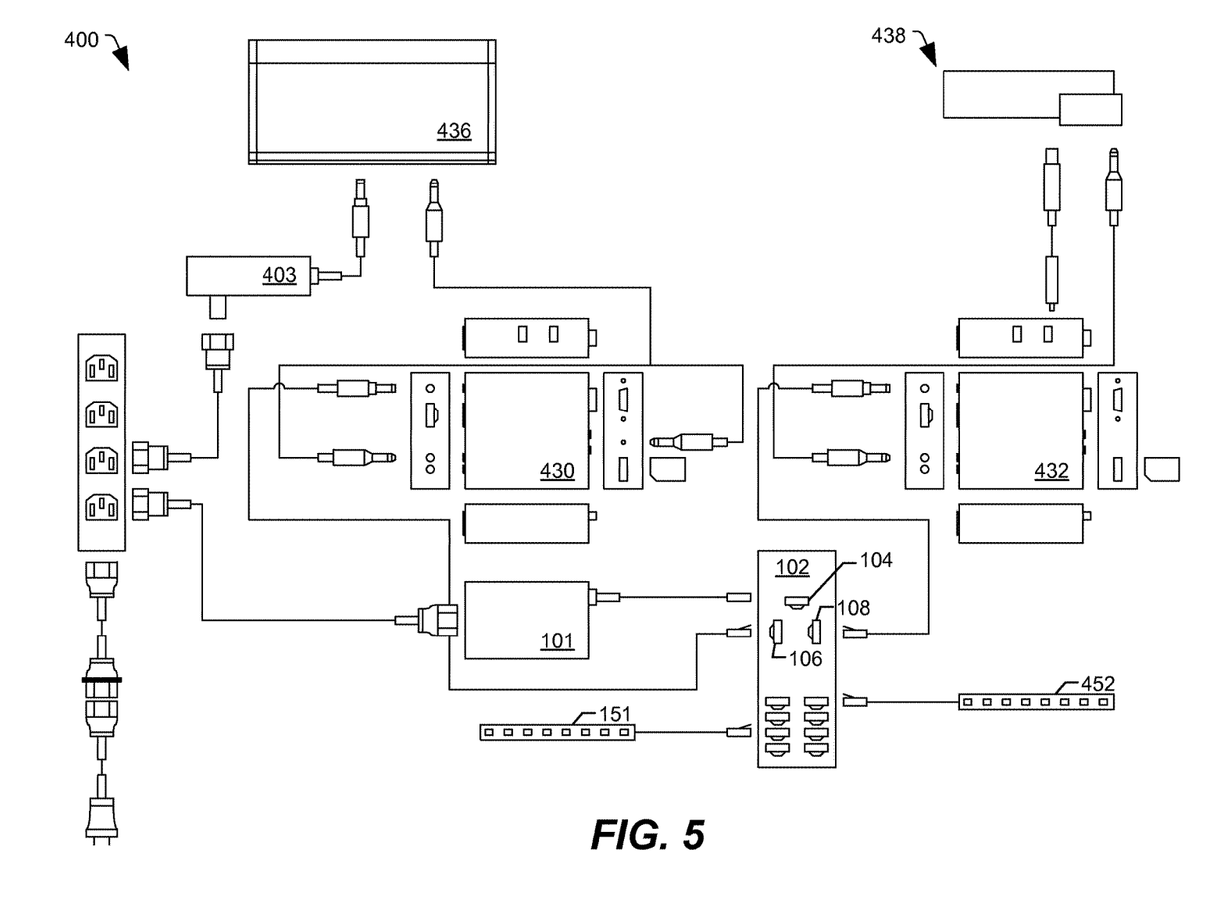
FIG. 5 is a diagram of another system including an electrical hub with a current sensor.

Referring to FIG. 5, a diagram of a system 400 that includes the electrical hub 102. In the system 400, the electrical hub 102 is coupled to a first demonstration engine 430 via the output connector 106 and to a second demonstration engine 432 via the second output connector 108.

The first demonstration engine 430 is configured to control operation of a first demonstration product 436 according to one of a first plurality of configuration states, as described above with reference to the demonstration engine 130 and the demonstration product 136. In the illustrated example, the first demonstration product 436 receives power from a second power supply 403. The second demonstration engine 432 controls operation of a second demonstration product 438 according to a second plurality of configuration states, as described above with reference to the demonstration engine 130 and the demonstration product 136. The electrical hub 102 stores data representing mappings (e.g., in the memory 116) between each of the first plurality of configuration states and an associated first expected current (e.g., a first reference value or range). The electrical hub 102 further stores data representing mappings between each of the second plurality of configuration states and an associated second expected current.

In operation, both of the demonstration engines 430, 432 report state indicators to the electrical hub 102 when changing configuration states. The processor 114 is configured to compare current detected by the current sensor 110 to an expected current of the active configuration state of the first demonstration engine 430 to determine whether a first error associated with the active configuration state has occurred, as described above with reference to FIG. 2. Similarly, the processor 114 is configured to compare current detected by the second current sensor 112 to an expected current of the active configuration state of the second demonstration engine 432 to determine whether a second error has occurred in the second demonstration product 438. In examples, the electrical hub 102 is configured to output an error signal via the first LED 151, as described above, in response to detecting the first error. In other examples, the first LED 151 is a static load. In some examples, the electrical hub 102 is configured to output an error signal via a second LED 452 in response to detecting the second error. In other examples, the second LED 452 is a static load. In some examples, the electrical hub 102 is configured to output an error message (e.g., via the second communication interface 126 or via the communication interface 124 and the first demonstration engine 430 or the second demonstration engine 432) to a server (not shown in FIG. 5) in response to detecting the first error or the second error. Thus, FIG. 5 illustrates that a single electrical hub with current sensors detects errors associated with more than one device that has a plurality of configuration states.

Figure 6:
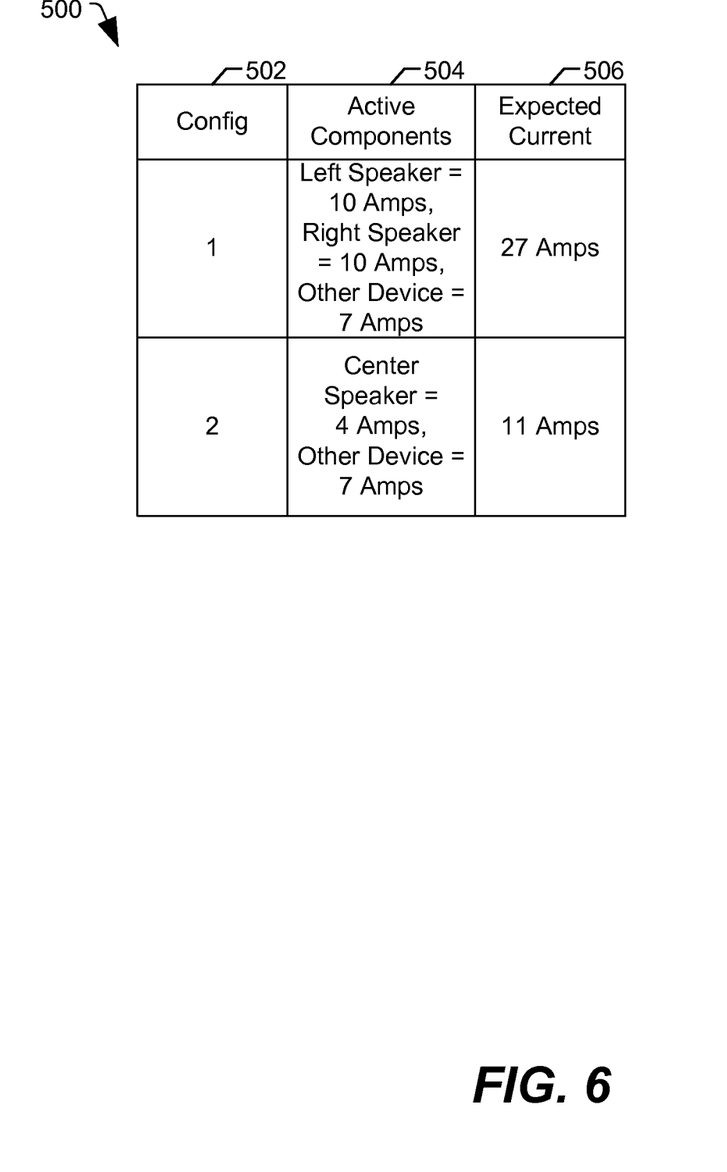
FIG. 6 is diagram illustrating a table that is used during operation of an electrical hub with a current sensor.

Referring to FIG. 6, an illustration of a table 500 is shown. In particular examples, data representing the table 500 is stored in a memory of an electrical hub, such as the electrical hub 102. In some examples, the table 500 corresponds to the table 186 or to the table 120. The table 500 includes 3 columns. A first column 502 includes values identifying configuration states of a first device (e.g., the device 190 or the demonstration engine 130). For example, a first row of the first column 502 includes a value indicating a first group of the configuration states (e.g., a first state). A second column 504 indicates components of one or more devices that are active during the corresponding configuration state.

Examples of such components include static loads, such as the device 202, that draw a relatively constant current when coupled to an electrical hub. The second column 504 further identifies expected current draws of each component identified. In an illustrative example, the configuration states listed in the first column 502 correspond to the demonstration engine 130 and the components listed in the second column 504 are components of the demonstration product 136 and the other device 202. A third column 506 indicates a total expected current value configuration state of the first device. In alternative examples, the third column 506 indicates an expected current range for each configuration state of the first device. In other examples, the table 500 includes different numbers of columns. In an illustrative example, when more than one expected current value is associated with each configuration state, as described with reference to FIG. 3, the second column 504 and the third column 506 are repeated for each expected current value.

The table 500 enables an electrical hub, such as the electrical hub 102, to identify or to narrow down which component or device powered by the electrical hub 102 is malfunctioning. As explained above, the electrical hub 102 determines a difference between the expected current (e.g., a reference value) and a detected current value to determine if an error has occurred in a particular configuration state. By comparing the difference to the expected current draws for each component listed in the second column 504, the electrical hub 102 may identify which component is inoperable or narrow down a list of components that may be inoperable. To illustrate, when the demonstration engine 130 is operating in the second state of the table 500 and the difference is equal to 4 amps, the electrical hub 102 identifies the center speaker as the inoperable component based on the second column 504.

Thus, FIG. 6 illustrates a table that enables an electrical hub to detect errors in another device. The table further enables the electrical hub to identify which component of the other device in particular is inoperable.

Figure 7:
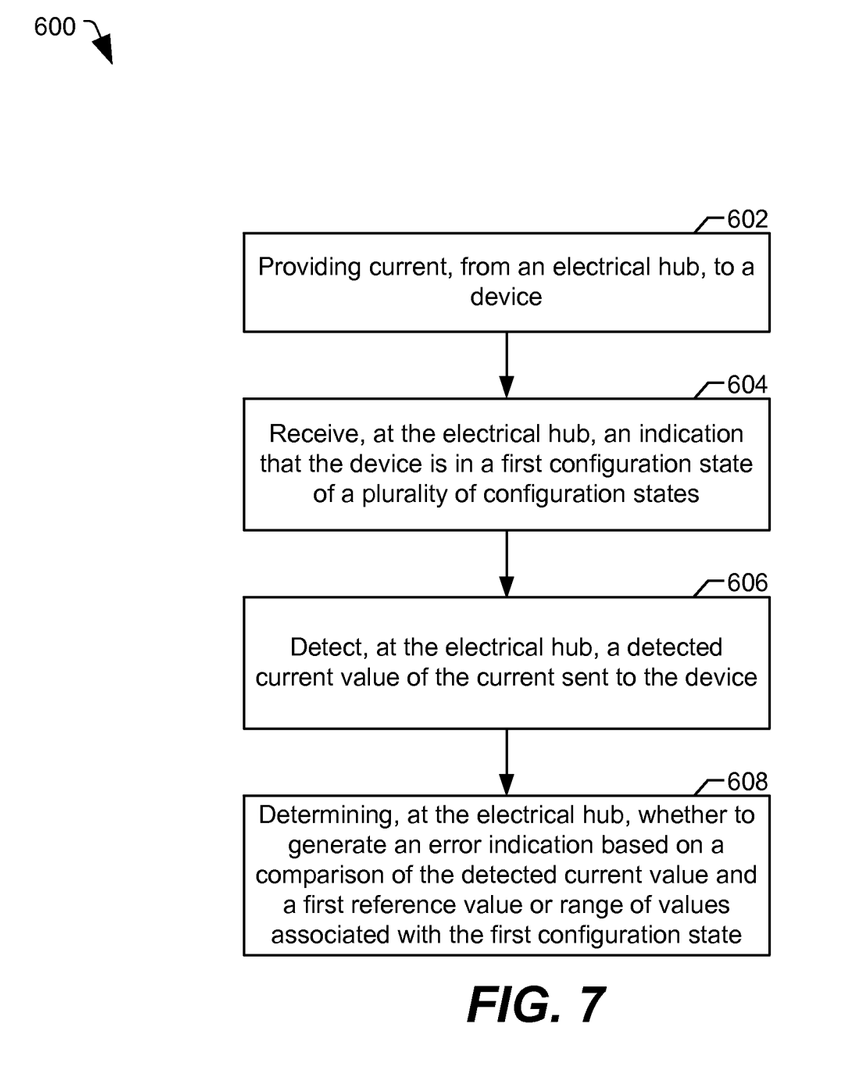
FIG. 7 is a method of detecting, at an electrical hub with a current sensor, errors at another device.

Referring to FIG. 7, a method 600 of operating an electrical hub with a current sensor is shown. The method 600 includes providing current, from an electrical hub, to a device, at 602. To illustrate, the electrical hub 102 provides current to the device 190. The method 600 further includes receiving, at the electrical hub, an indication that the device is in a first configuration state of a plurality of configuration states, at 604. To illustrate, the electrical hub 102 receives the state indicator 178 from the device 190. The state indicator 178 indicates one of the plurality of configuration states according to which the device 190 is operating.

The method 600 further includes detecting, at the electrical hub, a detected current value of the current sent to the device, at 606. To illustrate, the processor 114 receives the detected current value 174 from the current sensor 110 of the electrical hub 102.

The method 600 further includes determining, at the electrical hub, whether to generate an error indication based on a comparison of the detected current value and a first reference value or a range of values associated with the first configuration state, at 608. To illustrate, the processor 114 of the electrical hub 102 determines whether to generate and output an error indicator (e.g., via an LED or as a message to a server) based on comparing the detected current value 174 to the expected current value or range of values listed in an entry of the table 186 indicated by the state indicator 178. Thus, the method 600 is useable by an electrical hub to detect errors in components of another device based on detected current.

Figure 8:
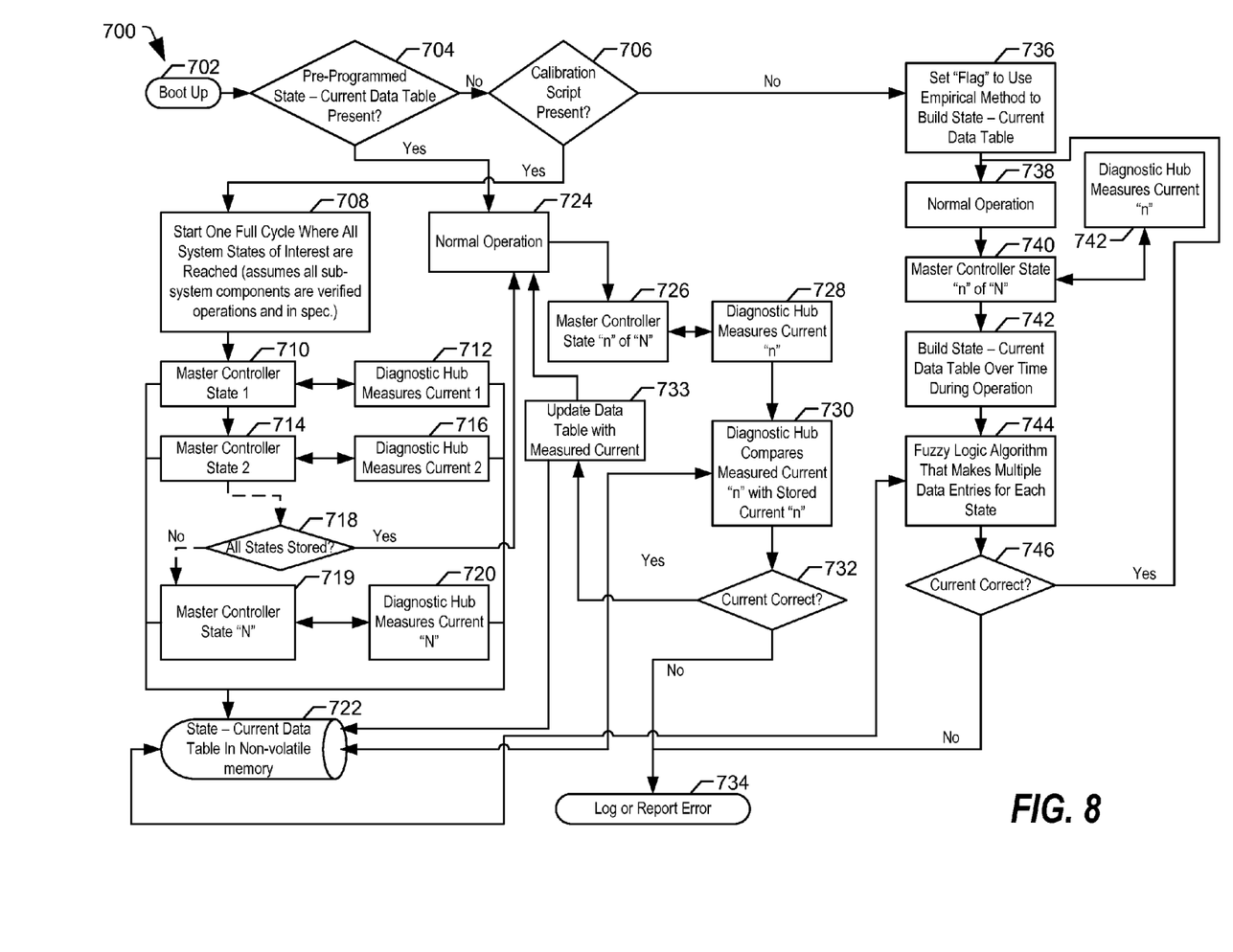
FIG. 8 is a method of detecting errors at a device, the method performed by a system that includes a current sensor.

Referring to FIG. 8, a flowchart of a method 700 of operating a system that includes an electrical hub with a current sensor is shown. In a particular illustrative example, the method 700 is performed by one of the systems 170, 100, 200, 300, 400. The method 700 includes booting up a, at 702. To illustrate, the demonstration engine 130 boots up upon being powered on.

The method 700 further includes determining whether a pre-programmed state-current data table 722 is present, at 704. To illustrate, the demonstration engine 130 determines whether the second memory 134 includes the table 120 and/or queries the electrical hub 102 to ascertain whether the memory 116 includes the table 120. When the pre-programmed state-current data table 722 is present, the method 700 includes performing normal operation, at 724. The method 700 further includes entering a master controller state "n" of "N", at 726. The method 700 further includes measuring current "n" at a diagnostic hub, at 728. To illustrate, in response to determining that the table 120 is stored in the memory 116 or in the second memory 134, the demonstration engine 130 beings to operate the demonstration product 136 according to one of the plurality of configuration states (e.g., configuration state "n" of the "N" configuration states in the plurality of configuration states). The demonstration engine 130 sends the state indicator 118 to the electrical hub 102 (e.g., a diagnostic hub). The state indicator 118 indicates that the demonstration engine 130 is operating the demonstration product according to the "n" configuration state. The processor 114 receives the detected current value 128 at the processor 114.

The method 700 further includes the diagnostic hub comparing the measured current "n" with stored current "n" stored in the state-current data table 722, at 730, and determining whether the current is correct, at 732. To illustrate, the processor 114 compares the detected current value 128 to the expected current value or range of the "n" entry of the table 120. If a difference between the detected value 128 is and the expected current value satisfies a threshold or if the detected current value 128 is within the expected current range, the processor 114 determines that the current is correct. If the difference between detected current value 128 the expected current value does not satisfy the threshold or if the detected current value 128 is outside the expected range, the processor 114 determines that the current is not correct.

When the current is not correct, the method 700 includes logging or reporting an error, at 734. To illustrate, the processor 114 outputs an error indication via the LED 151 or as the error message 152. In some examples, the processor 114 logs the error in the memory 116 or reports the error to the demonstration engine 130 to be logged in the second memory 134.

Returning to 732, when the current is correct, the system updates the state-current data table 722 based on the measured current, at 733. In an example, the processor 114 averages the detected current value 128 with an expected current value of the "n" configuration state. Alternatively, the processor 114 incorporates the detected current value 128 into a distribution of current values used to derive an expected current value or range associated with the "n" configuration state. Depending on implementation, updates to the state-current data table 722 occur periodically or each time a measured current value matches an expected current value or range.

The method 700 further includes continuing with normal operation, at 724. To illustrate, the demonstration engine 130 continues to operate the demonstration product 136 and the system 100 continues to check for errors in each state the demonstration engine 130 enters.

Returning to 704, when no pre-programmed state-current data table is present, the method 700 includes determining whether a calibration script is present, at 706. To illustrate, the demonstration engine 130 determines whether a calibration script is present in the second memory 134. When the calibration script is present, the method 700 includes starting one full cycle where all system states of interest are reached, at 708, and entering a first master controller state, at 710. The method 700 further includes measuring a first current at the diagnostic hub and storing the measured first current in the state-current data table 722, at 712. To illustrate, when the demonstration engine 130 determines a calibration script is present, the demonstration engine 130 enters a calibration mode and begins to cycle through each configuration state of the plurality of configuration states. While the demonstration engine 130 is operating according to a first configuration state, the demonstration engine sends a first state indicator indicating the first configuration state to the electrical hub 102. In response to the first state indicator, the electrical hub 102 records a first detected current value identified the current sensor 110 in the table 120 stored in the memory 116 and/or reports the first detected current value to the demonstration engine 130 to be recorded in the table 120 stored in the second memory 134.

The method 700 further includes the master controller entering a second state, at 714. The method 700 further includes measuring a second current at the diagnostic hub and storing the measured second current in the state-current data table 722, at 712. To illustrate, the demonstration engine 130 begins to operate according to a second configuration state of the plurality of configuration states and sends a second state indicator indicating the second state to the electrical hub 102. In response to the second state indicator, the electrical hub 102 records a second detected current value identified the current sensor 110 in the table 120 stored in the memory 116 and/or reports the second detected current value to the demonstration engine 130 to be recorded in the table 120 stored in the second memory 134.

The method 700 includes determining whether all states have been stored, at 718. When all states have not been stored, the method 700 includes continue to cycle through each state and measuring each corresponding current until all "N" states have been associated with a current, at 719 and 720. Once all "N" states have been stored, the method 700 include beginning normal operation, at 724, as described above.

Returning to 706, when no calibration script is present, the method 700 includes setting a "flag" to use an empirical method to build state-current data table, at 736, and beginning normal in-store operation, at 738. To illustrate, in a particular example, the demonstration engine 130 determines to begin to operate normally without the table 120 in the memory 116 or the second memory 134 and to build the table 120 based on empirical observations. In a particular example, the demonstration engine 130 sets a flag in the second memory indicating that the system 100 is operating in an empirical observation mode.

The method 700 further includes entering a master controller state "n" of "N," at 740, and measuring current "n" at the diagnostic hub, at 742. For example, the demonstration engine 130 enters into the state "n" and sends the state indicator 118 to the electrical hub 102. The electrical hub 102 identifies the detected current value 128 at the current sensor 110.

The method 700 further includes building the state-current data table 722 over time during operation by applying a fuzzy logic algorithm that makes multiple data entries for each state, at 742, 744. In a particular illustrative example, the processor 114 adds the detected current value 128 to a row of the table 120 corresponding to the "n" configuration state. The processor 114 adds a detected current value to the "n" row each time the demonstration engine 130 sends a state indicator indication the "n" configuration state.

The method 700 further includes determining whether the current is correct, at 746. To illustrate, the processor 114 determines a difference between the detected current 128 and other entries in the row corresponding to the "n" configuration state in the table 120. In a particular example, the processor 114 detects an error associated with the "n" configuration state in response to determining that a difference between an average of the values in the row corresponding to the "n" configuration state and the detected current value 128 is greater than a threshold.

When the current is not correct, the method 700 includes logging or reporting the error, at 734, as described above. It should be noted that in particular examples, the method 700 includes resuming normal operation, at 724 or 738, once the error is logged or reported.

When the current is correct, the method 700 includes returning to normal operation, at 738.

Thus, the method 700 is useable by a system that includes an electrical hub with a current sensor to detect errors in a device. The method 700 is further useable by the system to build a table of expected current values to use in error detection when no pre-programmed table is available.

Embodiments of the systems and methods described above comprise computer components and computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

A number of implementations have been described. Nevertheless, it will be understood that additional modifications may be made without departing from the scope of the inventive concepts described herein, and, accordingly, other embodiments are within the scope of the following claims.

What is claimed is:

1. An apparatus comprising:
a power input connector configured to receive power from a power supply;
a device having a plurality of components associated with the device;
a power output connector configured to supply power to the device;
a current sensor coupled to the power output connector;

a communications interface; and a processor configured to:
receive, via the communication interface, a first indication that the device is in a first configuration state corresponding to a first operation of a plurality of operations executable by the device, wherein the first configuration state is one of a plurality of configuration states each corresponding to one of the plurality of operations, wherein each configuration state is associated with a different set of the plurality of components and a corresponding expected current value or an expected range of current values;

receive, via the communication interface, a second indication that the first configuration state has transitioned into a second configuration state corresponding to a second operation of the plurality of operations;

receive, after the transition to the second configuration state, a current value from the current sensor;

determine that an error has occurred with regard to the device based on a comparison of the current value received from the current sensor and an expected current value or an expected range of current values associated with the second configuration state; and generate an indication of the determined error.

2. The apparatus of claim 1, wherein the processor is further configured to:
receive a second current value from the current sensor; and
determine whether to generate an error indication based on a comparison of the second current value and a second expected current value or a second range of expected current values.

3. The apparatus of claim 1, further comprising a second communication interface.

4. The apparatus of claim 1, wherein the device is configured to output first signals that drive a first set of components of a second device while the device is in the first configuration state, and wherein the device is configured to output second signals that drive a second set of the components of the second device while the device is in the second configuration state.

5. The apparatus of claim 4, wherein the first signals correspond to a first audio demonstration, the second signals correspond to a second audio demonstration, and each of the components of the first set of components is a speaker.

6. The apparatus of claim 1, further comprising a memory storing reference values corresponding to each of the plurality of configuration states.

7. The apparatus of claim 1, wherein the processor is configured to output an error indication in response to determining that a difference between the expected current value and the received current value exceeds a threshold.

8. A method of operating an electric hub, comprising:
providing current, from the electrical hub, to a device, wherein the device has a plurality of components associated with the device;
receiving, via a communication interface, a first indication that the device is in a first configuration state corresponding to a first operation of a plurality of operations executable by the device, wherein the first configuration state is one of a plurality of configuration states each corresponding to one of the plurality of operations, wherein each configuration state is associated with a different set of the plurality of components and a corresponding expected current value or an expected range of current values;

receive, via the communication interface, a second indication that the first configuration state has transitioned into a second configuration state corresponding to a second operation of the plurality of operations;
detecting, after the transition to the second configuration state, a current value of a current sent to the device;
determining that an error has occurred with regard to the device based on a comparison of the detected current value and a first expected current value or a first expected range of current values associated with the second configuration state; and
generating an indication of the determined error.

9. The method of claim 8, further comprising identifying an inoperable component of a second device by comparing a difference between the first expected current value and the detected current value to an expected current draw of the inoperable component.

10. The method of claim 9 wherein the inoperable component is identified based on the difference between the first expected current value and the detected current value being less than a threshold.

11. The method of claim 8, wherein the first expected current value or the first expected range of values corresponds to an expected amount of current to be drawn by the device when the device operates according to the first configuration state.

12. The method of claim 8, further comprising:
detecting, at the electrical hub, a second detected current value of the current; and
determining whether to generate an error indication based on the second detected current value and a second expected current value or a second expected range of values associated.

13. The method of claim 8, further comprising determining expected current values associated with the plurality of configuration states based on current values detected during normal operation of the electrical hub and the device.

14. The method of claim 8, further comprising:
providing second current to another device, the second current distinct from the current sent to the device;
detecting, at the electrical hub, a second detected current value of the second current sent to the other device; and
determining whether to generate an error indication based on a comparison of the second detected current value and a second expected current value or a second range of values.

15. The method of claim 8, further comprising updating the first expected current value or first expected range of values associated with the first configuration state to an updated expected current value or updated expected range of values.

16. A non-transitory computer readable storage medium storing instructions executed by a processor to perform operations for operating an electric hub, the operations including:
receiving, via a communication interface, a first indication at the electrical hub while the electrical hub provides a current to a device, wherein the device has a plurality of components associated with the device, the first indication indicating that the device is in a first configuration state corresponding to a first operation of a plurality of operations executable by the device, wherein the first configuration state is one of a plurality of configuration states each corresponding to one of the plurality of operations, wherein each configuration state is associated with a different set of the plurality of components and a corresponding expected current value or an expected range of current values;

receiving, via the communication interface, a second indication that the device has transitioned to a second configuration state corresponding to a second operation of the plurality of operations;

detecting after the transition to the second configuration state, a current value of a current sent to the device;

determining that an error has occurred with regard to the device based on comparing the detected current value and an expected current value or an expected range of current values associated with the second configuration state; and generating an indication of the determined error.

17. The non-transitory computer readable storage medium of claim 16, wherein the operations further include:

receiving a third indication at the electrical hub while the electrical hub provides a third current to the device; and detecting, at the electrical hub a detected current value of the third current sent to the device.

* * * * *